United States Patent [19]

Campioni

[11] 4,097,815
[45] Jun. 27, 1978

[54] AMPLIFYING CIRCUIT

[75] Inventor: Armando Campioni, Turin, Italy

[73] Assignee: Indesit Industria Elettrodomestici Italiana S.p.A., Rivalta (Turin), Italy

[21] Appl. No.: 671,645

[22] Filed: Mar. 29, 1976

[30] Foreign Application Priority Data
Apr. 9, 1975 Italy .............................. 67907 A/75
May 19, 1975 Italy .............................. 68285 A/75

[51] Int. Cl.² ........................................... H03F 1/32
[52] U.S. Cl. .................................... 330/289; 315/389; 330/263; 330/293
[58] Field of Search ............... 315/387, 397, 403, 411, 315/389; 330/263, 289, 293

[56] References Cited
U.S. PATENT DOCUMENTS

| | | | |
|---|---|---|---|
| 3,215,851 | 11/1965 | Warnock | 330/32 X |
| 3,529,252 | 9/1970 | Long | 330/13 |
| 3,781,589 | 11/1971 | Brockman | 315/397 X |
| 3,825,849 | 7/1974 | Linder | 330/32 X |
| 3,939,380 | 2/1976 | Peer | 315/387 X |

*Primary Examiner*—Lawrence J. Dahl
*Attorney, Agent, or Firm*—Sughrue, Rothwell, Mion, Zinn and Macpeak

[57] ABSTRACT

An amplifier circuit suitable for use as a video amplifier in a color television circuit for driving the variable impedance load provided by a color television picture tube, in which the load impedance of the amplifier element of the circuit is also made variable. This is achieved, in one embodiment by using as the output stage of the amplifier two transistors with a complementary symmetrical configuration so that one is always substantially cut-off while the other conducts. In another embodiment a transistor in common collector configuration acts as the amplifier element and its emitter from which the output of the amplifier is taken is connected by a diode to the collector of a transistor which feeds the base of the common collector transistor.

3 Claims, 4 Drawing Figures

4,097,815

AMPLIFYING CIRCUIT

The present invention relates to an amplifying circuit, and more particularly to an amplifying circuit suitable for forming part of a video circuit for a television receiver.

There are various known circuits capable of operating as video amplifiers, but all include transistors which operate under class A conditions and which dissipate a considerable amount of power. This is due to the fact that in order to obtain the required band width it is necessary to use only moderate load impedances. Thus, since for example the control voltage of a colour picture tube is of the order of 100-200 V the currents in the transistor at the impedance values normally used are in the region of tens of milliamps, and therefore the dissipated power is of the order of a few watts. It is therefore necessary to use power transistors which require a heat dissipator, and likewise the load resistors must be capable of dissipating several watts. All this means that rather costly components are required.

Furthermore, because all video amplifiers require a stabilised supply voltage in order to ensure correct operation and in particular in order to prevent any variation in contrast as the main supply voltage varies, it is usually necessary to provide stabilising circuits which further complicate the amplifier circuits. It is not possible to draw the required supply voltage directly from the stabilised horizontal deflection circuits because of the considerable power consumed by the amplifiers.

The present invention seeks therefore to provide a video amplifying circuit, for a television receiver, in which the disadvantages mentioned above are overcome, or at least reduced in effect.

According to the present invention, there is provided an electrical amplifier circuit having at least one amplifier element, for providing high voltages for driving a user device whose impedance varies with frequency, characterised by the fact that the load impedance of the said amplifier element is variable.

Various embodiments of the invention will now be described, by way of example, with reference to the accompanying drawings, in which.

Figure 1:
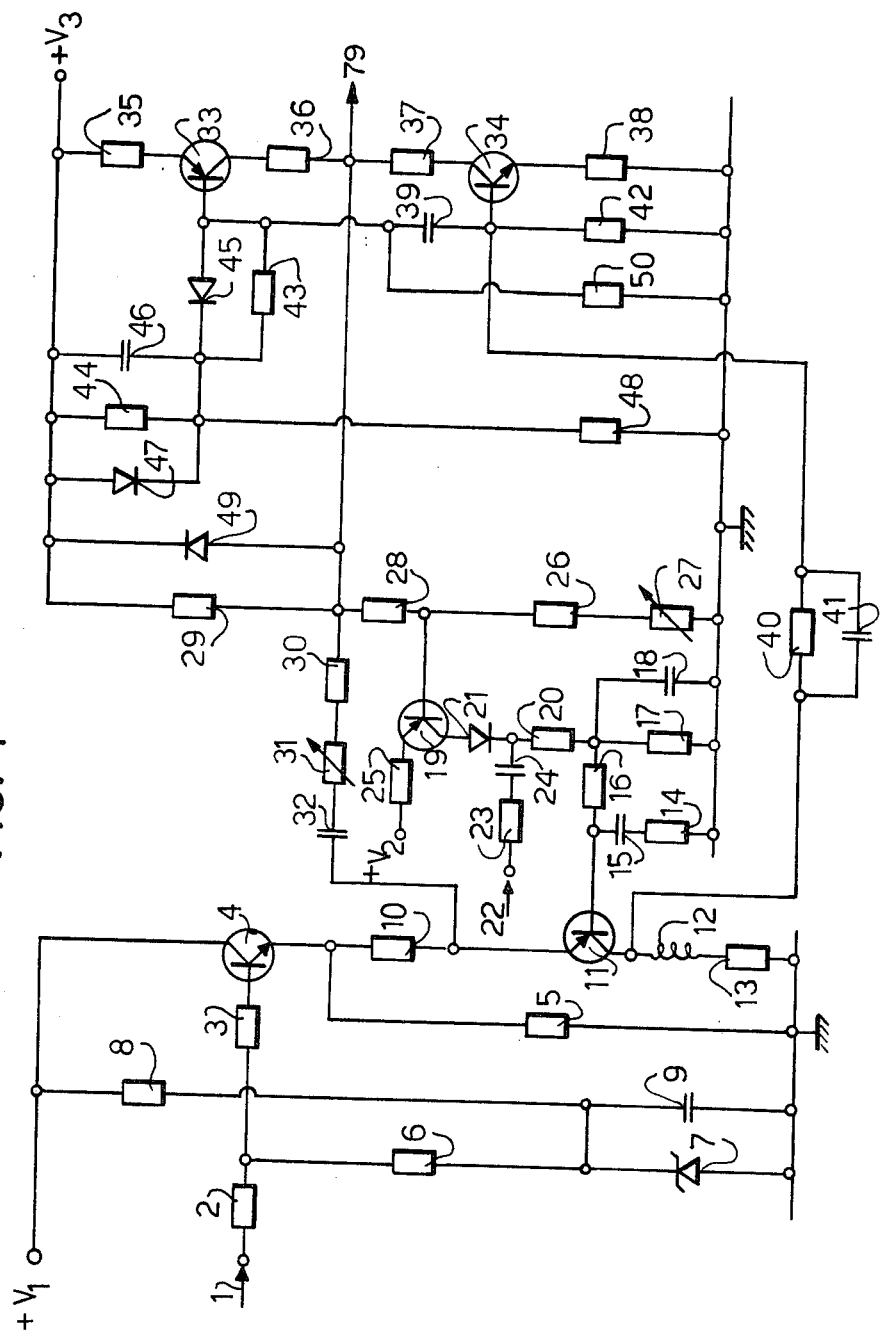
FIG. 1 is an electrical diagram of a video amplifier constructed as a first embodiment of the invention.

Referring now to the drawings, in the amplifier circuit of FIG. 1, the input signal is fed to a terminal 1 and is fed through two series connected resistors 2 and 3 to be applied to the base of an NPN transistor 4 which is connected in a common collector configuration.

The collector of the transistor 4 is connected to a first supply voltage source $+V_1$, whilst the emitter is earthed via a resistor 5. The junction between the two input resistors 2 and 3 is earthed via a resistor 6 and a Zener diode 7, in series and the junction between the resistor 6 and the diode 7 is connected to the voltage source $+V_1$ through a resistor 8 and to earth through a capacitor 9. The network formed by the resistors 3, 6, 8 and by the Zener diode 7 is a biasing network for the transistor 4; it also serves as a limiter circuit to limit the maximum amplitude of the video signal, in particular, the amplitude of the synchronisation pulses, for the purpose of making the clamping operations, effected downstream, independent of any amplitude differences in the signal which is supplied to the video amplifier by the circuits upstream of it. The video signal output of the transistor 4, taken from the emitter, is fed through a resistor 10 to the emitter of a PNP transistor 11 connected in cascade with the transistor 4. The collector of the transistor 11 is connected to earth through an inductor 12 and a resistor 13 in series, and the base of the transistor 11 is connected to earth through a resistor 14 and a capacitor 15 in series. The LC and RC networks constituted by the resistors 13 and 14, the inductor 12 and capacitor 15 act as phase shifting networks to compensate for phase displacements introduced by the parasitic elements present in the circuit.

The base of the transistor 11 is also connected to the first terminal of a resistor 16, whose other terminal is connected to earth through a resistor 17 and a capacitor 18 in parallel and also to the collector of a PNP transistor 19 through a resistor 20 and a diode 21 in series. To the junction of the cathode of the diode 21 with the resistor 20 there is connected a resistor 23 and a capacitor 24 in series. The resistor 23 has a terminal 22 to which is fed the line return pulse. The emitter of the transistor 19 is connected to a supply voltage source $+V_2$ through a resistor 25.

The base of the transistor 19 is earthed through a resistor 26 and a variable resistor 27 in series, and is also connected to a supply voltage source $+V_3$ through two resistors 28 and 29 in series. Across the resistor 29 is connected a protection diode 49.

The junction between the resistors 28 and 29 is connected to the emitter of a transistor 11 through a resistor 30, a variable resistor 31, and a capacitor 32 in series. The transistor 19 with the associated components serves to control the bias of the final stage of the video amplifier, which latter is constituted by two transistors 33 and 34 respectively PNP and NPN, mounted in a complementary symmetrical configuration.

The emitter of the transistor 33 is connected to the voltage supply source $+V_3$ through a resistor 35, the colector is connected to a resistor 36 which is connected in series with another resistor 37 which is connected to the collector of the transistor 34, the emitter of which is connected to earth through a resistor 38. The bases of the two transistors 33 and 34 are connected together through a capacitor 39, and the base of the transistor 34 is earthed through a resistor 42. The output from the circuit is taken from the junction between the two resistors 36 and 37.

The base of the transistor 34 is fed with the video signal from the collector of the transistor 11 via an RC circuit comprising a resistor 40 and a capacitor 41 in parallel, which acts to compensate for phase displacements present in the circuit.

The base of the transistor 33 is connected to the voltage supply $+V_3$ via a resistor 43 having a diode 45 in parallel with it and a resistor 44 having a diode 47 and a capacitor 46 in parallel with it. The diode 47 serves to supply a bias voltage equal to the voltage between the base and the emitter of the transistor 33 so as to keep the transistor 33 ready to conduct when it has to change from a non-conducting to a conducting state. The junction between the resistors 43 and 44 is earthed via a resistor 48.

The diode 45, like the diode 49 in parallel with the resistor 29, is a protection diode. The base of the transistor 33 is connected to earth through a resistor 50.

The operation of the amplifier circuit described with reference to FIG. 1 is as follows:

The circuit of the transistors 4 and 11 is a control circuit which controls the final stage comprising the circuit of the transistors 33 and 34 which are connected in a complementary symmetrical configuration, such that the transistor 34 conducts during the positive half-wave of the signal whilst the transistor 33 conducts during the negative half-wave. In order to avoid crossover distortion the two transistors are not completely cut off during the periods of non-conduction, but are kept in a slightly conductive condition, so that when the polarity of the wave form innerts and the conducting transistor becomes cut-off, there is no delay in the start of conduction of the previously nonconducting conducting transistor. The pass-band is obtained in this case by the negative feed-back of the amplifier provided by the RC network composed of the resistors 30 and 31 and the capacitor 32. The negative feed-back is taken from the output of the final stage to the input of the transistor 11, which controls the final stage.

The power supply to the final stage is provided by the voltage source $+V_3$ which does not require much stabilisation because of the stabilisation control of the transistor 19. In fact, the voltage at the output of the amplifier, which is taken from the terminal 79 is also fed to a voltage divider formed by the resistors 29, 28, 26 and 27 and thus controls the base of the transistor 19, which generates from it and the stabilised voltage $+V_2$ a bias control voltage. The comparison of the stabilised voltage $+V_2$ with the output on the terminal 79 of the amplifier circuit only occurs during the line returns so as not to be tied to the type of picture transmitted, and for this reason the line return pulses drawn, in a known manner, from the horizontal deflection circuits are taken to the collector of the transistor 19, so that the transistor conducts only during the line return period.

In dependence on the degree of conduction of the transistor, and therefore on the voltage at its base, there appears across the filter network comprising the resistors 20, 17 and the capacitor 18 a voltage which is representative of the voltage present at the output of the first stage of the amplifier. This voltage, amplified by the transistor 11, is taken to the base of the transistor 34 for the purpose of controlling its bias. In this manner, optimum stabilisation of the final stage is obtained without requiring complex stabilisation circuits in the power supply circuits of the television receiver.

From the above description, the advantages obtained over the prior art will be apparent to those skilled in the art particularly the avoidance of components which dissipate considerable power. This is possible because of the fact that the load impedance is greater than in known circuits and consequently the current in the stage is less. In the circuit shown in FIG. 1 the collector current is 8mA, whereas in previously known video amplifier circuits of this type the current is of the order of 30 mA: the improvement obtained can readily be appreciated. It is thus possible to use transistors of 1 W power dissipation instead of transistors of 5 W. Furthermore, because the power consumption of this stage is constant and sufficiently low, it is possible to draw the supply voltage from the horizontal deflection circuits, thus making use of a supply voltage which is already stabilised against the variations in consumption of the television receiver caused by the variations in the picture content and the control of contrast and brightness.

With respect to known circuits there is a further ecomony of components due to the fact that it is not necessary with this circuit, to provide compensation coils for the other frequencies at the output of the amplifier.

With regard to the load impedance, this is greater than in previous circuits because of the fact that the load resistance is provided largely by the resistance presented by the transistor which is not conducting at any one line, and the reactance is also greater because the parasitic capacities are less.

The following table indicates the values of the circuit elements of the circuit of FIG. 1, this being an embodiment of the invention which has been tested and proven in practice to operate successfully.

TABLE OF VALUES.

| RESISTORS | | CAPACITORS | |
|---|---|---|---|
| 2 | 47 Ohm | 9 | 10 μF |
| 3 | 10 Ohm | 15 | 56 pF |
| 5 | 1 K ohm | 18 | 22 μF |
| 6 | 2.7 K ohm | 24 | 0.1 μF |
| 8 | 1 K ohm | 32 | 10 μF |
| 10 | 220 Ohm | 39 | 4.7 μF |
| 13 | 680 Ohm | 41 | 330 pF |
| 14 | 100 Ohm | 46 | 0.1 μF |
| 16 | 6.8 K ohm | INDUCTORS | |
| 17 | 33 K ohm | 12 | 0.2 nH |
| 20 | 10 K ohm | TRANSISTORS | |
| 23 | 100 Ohm | 4 BC | 148 B |
| 25 | 180 Ohm | 11 BC | 158 B |
| 26 | 3.3 K ohm | 19 BC | 158 B |
| 27 | 2.2 K ohm | 33 MPS | A92 |
| 28 | 47 K ohm | 34 MPS | A42 |
| 29 | 56 K ohm | SUPPLIES | |
| 30 | 6.8 K ohm | $+V_1 =$ | 26 V |
| 31 | 4.7 K ohm | $+V_2 =$ | 11 V |
| 35 | 180 Ohm | $+V_3 =$ | 200 V |
| 36 | 1 Ohm | | |
| 37 | 1 K ohm | | |
| 38 | 180 Ohm | | |
| 40 | 2.7 K ohm | | |
| 42 | 2.7 K ohm | | |
| 43 | 2.2 M ohm | | |
| 44 | 2.2 M ohm | | |
| 48 | 56 K ohm | | |
| 50 | 4.7 M ohm | | |

Figure 2:
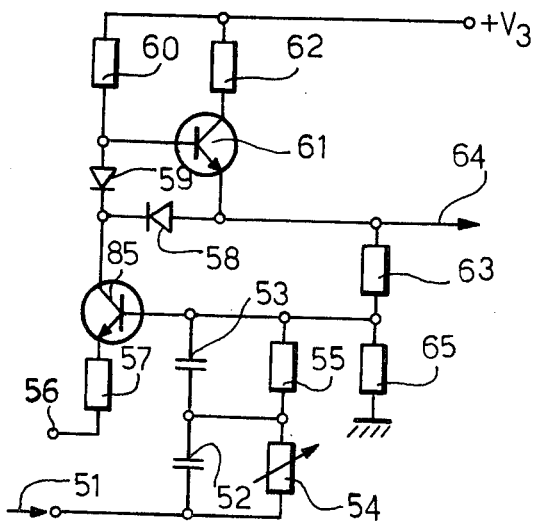
FIG. 2 is an electrical diagram of a video amplifier formed as a second embodiment of the invention.

The embodiment illustrated in FIG. 2 has the advantages of the embodiment of FIG. 1, but achieves them in a simpler manner.

Referring now to FIG. 2 there is shown an amplifier circuit having an input terminal 51 which is connected by an input circuit comprising two capacitors 52 and 53 in series with one another and two resistors 54 and 55 in series with one another and in parallel with the capacitors 52 and 53 to the base of an NPN transistor 85 connected in common emitter configuration.

The emitter of the transistor 85 is in effect connected to a source of biasing voltage (terminal 56) through a resistor 57 of low value. The collector of the transistor 85 is connected to the junction point of the cathodes of two diodes 58 and 59; the anode of the diode 59 is connected to one terminal of a resistor 60 the other terminal of which is connected to a supply potential $+V_3$ and to the base of a second NPN transistor 61. The collector of the transistor 61 is connected via a resistor 62, to the supply potential $+V_3$. The emitter of transistor 61 is connected to the anode of the diode 58, to one terminal of a resistor 63 and to an output terminal 64. The other terminal of the resistor 63 is connected to the base of the transistor 85 and, through a resistor 65, to earth.

Figure 3:
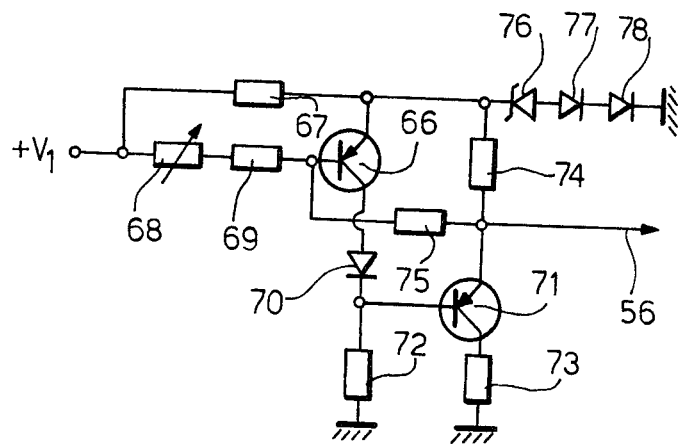
FIG. 3 is an electrical diagram of a power supply circuit for the amplifier of FIG. 2.

In the circuit of FIG. 3 a positive supply potential $+V_1$ feeds the electrodes of the emitter and the base of a PNP transistor 66 through, respectively, a resistor 67 and two resistors 68 and 69, in series the former of which is a variable resistor.

The collector of the transistor 66 is connected to the anode of a diode 70, whose cathode is connected to the base of a second PNP transistor 71 and to one terminal of a resistor 72 the other terminal of which is connected to earth. The collector of the transistor 71 is also connected to earth through a resistor 73. The emitter of the transistor 71 is connected to an output terminal 56, to the emitter of the transistor 66 through a resistor 74 and to the base of the transistor 66 through a resistor 75.

Between the emitter of the transistor 66 and earth are connected in series a Zener diode 76 and two normal diodes 77 and 78.

The following table shows, by way of example, the values of the circuit elements in one embodiment each of the circuits of FIG. 2 and FIG. 3 which have proven in practice to be operative.

TABLE

| RESISTORS | | CAPACITORS | | |
|---|---|---|---|---|
| 54 | 2.2 KΩ | 52 | 18 | pF |
| 55 | 1.5 KΩ | 53 | 18 | pF |
| 57 | 6.8 Ω | | | |
| 60 | 47 KΩ | | | |
| 62 | 1 KΩ | DIODES. | | |
| 63 | 47 KΩ | 58 | 1N | 4148 |
| 65 | 3.3 KΩ | 59 | 1N | 4148 |
| 67 | 1.5 KΩ | 70 | 1N | 4148 |
| 68 | 10 KΩ | 76 | ZV | 12 |
| 69 | 10 KΩ | 77 | 1N | 4148 |
| 72 | 4.7 KΩ | 78 | 1N | 4148 |
| 73 | 560 Ω | | | |
| 74 | 2.2 KΩ | TRANSISTORS | | |
| 75 | 4.7 KΩ | 85 | MPSA 42 | |
| SUPPLY | | 61 | MPSA 42 | |
| VOLTAGES | | 66 | BC 308 | |
| $+V_1$ | 26 V | 71 | BC 308 | |
| $+V_3$ | 220 V | | | |

The operation of the circuit of FIG. 2 is as follows:

The video signal to be amplified is fed to the terminal 51 and reaches the base of the transistor 85 through the compensating network constituted by the elements 52, 53, 54 and 55. The controllable element 54 can be used for adjusting the gain of the amplifier to the required value.

The signal appears amplified on the collector of the transistor 85 and, neglecting for the moment the two diodes 58 and 59, it is fed to the base of the transistor 61 and appears, amplified, at the emitter, and therefore at the output terminal 64.

The load resistor 63 of the transistor 61 provides a strong negative feed-back which serves to stabilise the gain of the amplifier and increase its band-width; with the values indicated the voltage gain is of the order of 26 and the band-width greater than 4 MHz.

The effect of the input capacitance of the picture tube which is fed from the terminal 64, is largely neutralised by the low output impedance of the transistor 61 and also by the strong negative feed-back.

The capacitance in parallel with the resistor 60 proves to be less than that present at the terminal 64. In consequence it is possible to select for the resistor 60 a relatively high value (for example 50 KΩ), thus reducing the current consumed by the transistor 85, and therefore the colour dissipation effect of this transistor and the resistor 60.

Likewise the resistor 63 can be of 50 KΩ and therefore the current and the power dissipation of the transistor 61 are comparable to those in the circuit of the transistor 85. Furthermore, when the maximum current passes through the transistor 85, the minimum current passes through the transistor 61 and vice versa, so that the total current absorbed is relatively constant.

The circuit of FIG. 2 as described so far would function very well in the transients when the current in the transistor 85 drops suddenly; in the transients of opposite sign (when the current in the transistor 85 increases suddenly) the transistor 61 becomes slower in cutting off and the operation is less satisfactory; it is during these transients that the diode 58 comes into action and, by becoming conductive, allows the terminal 64 to follow directly the voltage at the collector of the transistor 85 as it falls, short circuiting for a time the transistor 61.

The diode 59 serves to compensate for the variation of the $V_{be}$ of the transistor 61 with temperature variations, and the resistor 62 serves to protect the transistor 61 from sudden overvoltages at the point $+V_3$, due to picture tube discharges.

The terminal 56 could be simply connected to a source of reference potential (for example a Zener), which has a suitable value in relation to the biasing voltage which is fed to the terminal 51 as well as the input signal mentioned above. The circuit of FIG. 3 is a possible power supply circuit for supplying an appropriate potential to the terminal 56 and, at the same time, for compensating for variations in the characteristics of the transistor 85 in dependence on the temperature.

The circuit of FIG. 3 is similar to that of the amplifier of FIG. 2, except that it uses PNP transistors and the emitter of the first transistor (transistor 66) is connected to a stabilised source represented by the three diodes 76, 77, 78; as known, by connecting in series a Zener (diode 76) and two or more normal silicon diodes (diodes 77, 78) a reference voltage can be obtained which varies little with the temperature.

The input voltage $+V_1$ is the same as that which biases the input terminal 51 supplied with the video signal.

The voltage drift at the point 64 of the circuit of FIG. 2 is, for a temperature variation of + 15° to 50° C, of the order of 5 Volts if the point 56 of FIG. 2 is connected to a fixed voltage; and is of the order of about 1 Volt if the point 56 of FIG. 2 is connected to the point 56 of FIG. 3.

Figure 4:
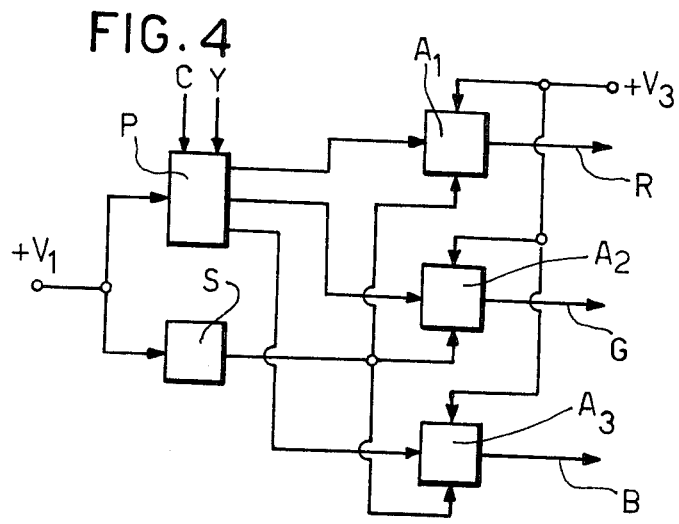
FIG. 4 is a block diagram of a part of a colour television receiver, comprising three amplifiers constructed as in FIG. 2 and a power supply circuit constructed as in FIG. 3.

FIG. 4 is a block diagram of a part of a colour television receiver circuit using the circuits of FIG. 2 and FIG. 3. In FIG. 4 there are shown three amplifiers $A_1$, $A_2$, $A_3$ identical to those of FIG. 2 for supplying the three colour picture tube with three primary signals R, G, B. The three amplifiers receive from a preamplifier-mixer P the three signals to be amplified. These also receive from a biassing source S, identical to that of FIG. 3, a stabilised and compensated bias voltage. The source S and the preamplifier P are fed by the voltage $+V_1$; the preamplifier P also receives the luminance signals Y and the chrominance signals C. The three amplifiers $A_1$, $A_2$, $A_3$, are also fed by the non-stabilised voltage source $+V_3$.

The arrangement of FIG. 4, with the values indicated in the table, has a total consumption from the source $+V_3$ of about 15 mA. Such a circuit arrangement lends itself easily to production by thick film techniques; it is possible to produce separately three identical modules $A_1$, $A_2$ and $A_3$, and the module S, or they can all be produced as parts of a single circuit.

It is also possible to produce on a single small silicone chip the same four circuits in the form of a monolithic integrated circuit, in view of the low overall dissipation; only the resistors 60 and 63 would need to be left as separate circuit elements.

The arrangement also lends itself to use with television picture tubes of the P.I.L. (Precision In Line) type, in which it is necessary to vary the bias of the cathodes; for this purpose it is sufficient to make the resistor 65 controllable.

The module P may be provided by one of the integrated circuits available on the market, for example, the type MC 1327.

The embodiments illustrated and described relate to video amplifier circuits for colour television receivers; it is however clear that circuits for other purposes (for example video amplifiers for black and white television receivers) can be made in accordance with the principles of the present invention without departing from the scope of the present invention as defined in the following claims.

What is claimed is:

1. An electrical amplifier circuit for providing high voltages for driving a user load impedance, the impedance value of which varies with frequency, such as a video amplifier circuit for a television receiver, said amplifier circuit comprising:

a first amplifier element (61) such as a transistor, having input and output terminals, and having an output impedance which is substantially lower than the minimum value of said load impedance within the frequency range of the signals fed to said amplifier circuit;

means for connecting said first amplifier output to said user load impedance;

a second amplifier element (85) such as a transistor, having input and output terminals;

means for connecting said second amplifier output terminal to said first amplifier input terminal;

a commutation element connected between the output terminal of said first amplifier element and the output element of said second amplifier element; and a diode (59) connected to the input of said first amplifier and to the output element of said second amplifier for compensation of said first amplifier for temperature variations.

2. The electrical amplifier circuit of claim 1, further comprising:

a negative feedback which is obtained by connecting the emitter of said first transistor to the base of said second transistor; and a biasing circuit for the emitter of said second transistor including at least one transistor of opposite conductivity type with respect to said second transistor, said at least one transistor being connected in a circuit similar to the circuit of said second transistor so as to obtain compensation for the variation in the voltage due to the thermal drift effect, wherein said biasing circuit comprises a third transistor connected in common collector configuration and a fourth transistor connected in a circuit corresponding to that of said second transistor, and is fed from the same voltage source which is used for biasing the base of the second transistor.

3. The amplifier circuit of claim 1, wherein the said first amplifier element having a low output impedance is a first transistor connected in common collector configuration and said commutation element is a semiconductor diode; said second amplifier element is a second transistor and said commutator element is connected between the emitter of said first transistor and the collector output electrode of said second transistor; and there is provided a negative feedback circuit obtained connecting the emitter of said first transistor to the base of said second transistor.

* * * * *